United States Patent [19]

Gersdorf

[11] Patent Number: 5,212,049

[45] Date of Patent: May 18, 1993

[54] RADIATION-SENSITIVE MIXTURE AND RECORDING MATERIAL BASED ON OLIGOMERIC MALEATES AND FUMARATES

[75] Inventor: Joachim Gersdorf, Wiesbaden, Fed. Rep. of Germany

[73] Assignee: Hoechst Aktiengesellschaft, Frankfurt am Main, Fed. Rep. of Germany

[21] Appl. No.: 641,514

[22] Filed: Jan. 15, 1991

[30] Foreign Application Priority Data

Jan. 19, 1990 [DE] Fed. Rep. of Germany ....... 4001465

[51] Int. Cl.$^5$ .............................................. G03F 7/033
[52] U.S. Cl. ................................... 430/285; 430/306; 430/309; 430/315; 430/328; 523/106
[58] Field of Search ................ 522/106; 430/285, 306, 430/309, 325, 327, 328

[56] References Cited

U.S. PATENT DOCUMENTS

| | | | |
|---|---|---|---|
| 3,628,963 | 12/1971 | Akamatsu et al. | 430/285 |
| 4,197,130 | 4/1980 | Nakamura et al. | 430/286 |
| 4,423,135 | 12/1983 | Chen et al. | 430/271 |
| 4,430,417 | 2/1984 | Heinz et al. | 430/286 |
| 4,638,019 | 1/1987 | Van Gentzkow et al. | 522/106 |

OTHER PUBLICATIONS

Barzynski et al., "Photopolymerisation", Chemiker–Zeitung, 1972, vol. 96, pp. 545–551.
Otsu et al., "Polymers from 1,2–Disubstituted Ethylenic Monomers, 2$^{a)}$ Homopolymers from Dialkyl Fumarates by Radical Initiator", Makromol. Chem., Rapid Commun., 1981, vol. 2, pp. 725–728.
Otsu, "Reactivities of Acrylic Monomers and Their Radicals in Radical Polymerization", Makromol. Chem., Macromol. Symp., 1987, vol. 10/11, pp. 235–254.
Roffey, "Photopolymerization of Surface Coatings", Wiley–Interscience, 1982, pp. 137–208.

Primary Examiner—Marion E. McCamish
Assistant Examiner—Christopher D. RoDee
Attorney, Agent, or Firm—Foley & Lardner

[57] ABSTRACT

A radiation-sensitive mixture is disclosed which contains as essential constituents
a) at least one thermoplastic, elastomeric block copolymer of the formulae $$(A\text{-}B)_m\text{—}A,\ (B\text{-}A)_{m+a}\text{—}B,\ (A\text{-}B)_{m+1}\text{ or }(A\text{-}B)_oY,$$

in which
A is a thermoplastic, nonelastomeric polymer block having a glass transition temperature of 25° C. or above and
B is an elastomeric polymer block having a glass transition temperature of 10° C. or below,
Y is Sn or Si,
m is an integer from 1 to 10, and
o is 2 if y is Sn, or 4 if y is Si,
b) at least one ethylenically polyunsaturated compound, and
c) a photopolymerization initiator, wherein at least one of the ethylenically polyunsaturated compounds corresponds to the formula I $$R{+}O\text{—}\overset{O}{\overset{\|}{C}}\text{—}CH{=}CH\text{—}\overset{O}{\overset{\|}{C}}\text{—}O\text{—}X{\overline{)_{n}}}O\text{—}\overset{O}{\overset{\|}{C}}\text{—}CH{=}CH\text{—}\overset{O}{\overset{\|}{C}}\text{—}O\text{—}R \quad (I)$$

where
R is a straight-chain or branched alkyl radical,
X is a straight-chain alkylene or cycloalkylene, it being possible for individual methylene groups to be substituted by —O—, —S—, carbonyl or carbonyloxy groups, and n is 1 to 5.

The mixture can be used to produce relief and flexographic printing plates having a high Shore A hardness. The recording layers on which the printing plates are based are stable on storage and exhibit a high photosensitivity.

37 Claims, No Drawings

RADIATION-SENSITIVE MIXTURE AND RECORDING MATERIAL BASED ON OLIGOMERIC MALEATES AND FUMARATES

BACKGROUND OF THE INVENTION

The present invention relates to a radiation-polymerizable mixture containing a polymeric binder, at least one ethylenically polyunsaturated compound and a photopolymerization initiator, and also to a recording material containing the radiation-sensitive mixture.

Photopolymerizable mixtures for producing relief printing plates which are used, for example, in the flexographic printing process contain a polymeric binder, a compound polymerizable by free radicals and a photopolymerization initiator. When exposed, the mixture is crosslinked and becomes insoluble. The compounds polymerizable by free radicals are esters of unsaturated carboxylic acids, in particular of acrylic and methacrylic acid, with polyhydric alcohols which may optionally contain urethane or ether groups.

DE 2,215,090 (=U.S. Pat. No. 4,423,135) describes a mixture of a thermoplastic elastomeric three-block copolymer, a photopolymerization initiator and an ethylenically unsaturated compound containing at least one terminal, ethylenically unsaturated group. The mixture has, however, only a low thermal stability. This manifests itself, for example, in the fact that plates which are insoluble in solvents —even when a thermal polymerization inhibitor is added—are produced in the thermoplastic processing during the production of an unexposed printing plate and in the case of simultaneous exposure to shearing forces or of storage at relatively high temperatures. The quality of a relief printing plate produced from this radiation-sensitive mixture is therefore considerably reduced. In extreme cases a relief image can no longer be produced. The ethylenically unsaturated compounds containing at least one terminal ethylenically unsaturated group described in DE 2,215,090 are, in particular, (meth)acrylates such as, for example, 1,6-hexanediol diacrylate. These compounds are relatively readily volatile and are known to cause irritation of the eyes, the respiratory organs and the skin in man.

DE 2,815,678 (=U.S. Pat. No. 4,197,130) describes a photosensitive mixture of a thermoplastic elastomeric block copolymer, a photopolymerization initiator and at least one ethylenically unsaturated compound. The ethylenically unsaturated compounds include diesters of fumaric acid or maleic acid with monofunctional alcohols, for example, bis(2-ethylhexyl) fumarate. A great disadvantage of the mixtures which contain these unsaturated compounds is their low photosensitivity, in particular in comparison with mixtures containing hexanediol diacrylate. This is because 1,2-disubstituted ethylenically unsaturated monomers have a lower polymerization reactivity than 1,1-disubstituted ethylenically unsaturated monomers (T. Otsu et al., *Makromol. Chem.*, Rapid Commun. 2: 725 (198) and T. Otsu, *Makromol. Symp.* 10/11: 235 (1987)). Furthermore, the photosensitivity of photopolymerizable mixtures depends on the functionality of the monomers: high crosslinking rates are known to be achievable only with polyfunctional monomers (C. G. Roffey, *Photopolymerization of Surface Coatings*, Wiley-Interscience, New York 1982, and H. Barzynski et al., *Chemiker-Zeitung* 96: 545 (1972)).

SUMMARY OF THE INVENTION

It is therefore an object of the present invention to provide a radiation-polymerizable mixture which, in addition to high storage and thermal stability, exhibits a high crosslinking rate during exposure. At the same time it is intended to ensure that the constituents of the polymerizable mixture have a good compatibility among themselves and, compared with mixtures which contain (meth)acrylates, have a lower volatility and a lower irritant effect.

These and other objects according to the invention are provided by a radiation-sensitive mixture, comprising, in admixture: a) at least one thermoplastic, elastomeric block copolymer of the formulae

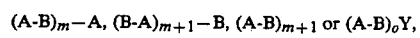

in which

A is a thermoplastic, nonelastomeric polymer block having a glass transition temperature of 25° C. or above, and B is an elastomeric polymer block having a glass transition temperature of 10° C. or below, Y is Sn or Si, m is an integer from 1 to 10, and o is 2 if y) is Sn, or 4 if y is Si, b) at least one ethylenically polyunsaturated compound, and c) a photopolymerization initiator, wherein at least one of the ethylenically polyunsaturated compounds corresponds to the formula I

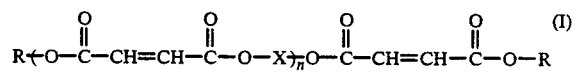

where

R is a straight-chain or branched alkyl radical,

X is a straight-chain alkylene or cycloalkylene, it being possible for individual methylene groups to be substituted by —O—, —S—, carbonyl or carbonyloxy groups, and n is 1 to 5.

The present invention also provides a recording material for producing relief and letterpress printing plates, comprising a layer base, and the radiation-sensitive mixture deposited on the layer base.

Also provided according to the invention is a process for producing a recording material, comprising the steps of depositing the radiation-sensitive mixture on a layer base, exposing the front side imagewise, and removing the unexposed parts of the layer with a developer.

Other objects, features and advantages of the present invention will become apparent from the following detailed description. It should be understood, however, that the detailed description and the specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENTS

According to the invention, a radiation-polymerizable mixture is provided which contains as essential constituents a) at least one thermoplastic, elastomeric block copolymer of the formulae

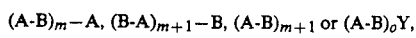

where
A is a thermoplastic, nonelastomeric polymer block having a glass transition temperature of about 25° C. or above, and
B is an elastomeric polymer block having a glass transition temperature of about 10° C. or below,
Y is Sn or Si,
m is an in integer from 1 to 10, and
o is 2 if y is Sn, or 4 if y, is Si,
b) at least one ethylenically polyunsaturated compound, and
c) a photopolymerization initiator, wherein at least one of the ethylenically polyunsaturated compounds corresponds to the formula I

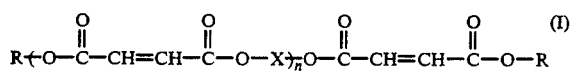

where
R is a straight-chain or branched alkyl radical,
X is a straight-chain alkylene or cycloalkylene, it being possible for individual methylene groups to be substituted by —O—, —S—, carbonyl or carbonyloxy groups, and
n is 1 to 5.

Those compounds in accordance with formula I are preferred in which the alkylene (X), insofar as it contains heteroatoms, is substituted by —O— or carbonyloxy. Of the alkylene radicals substituted by heteroatoms, those are particularly preferred in which only similar heteroatoms are present. Insofar as a methylene group is replaced by a carbonyloxy group, the alkyl radical containing this substituent has preferably only one such group.

R is in particular an alkyl radical containing 1 to 8, preferably containing 1 to 4, carbon atoms. Of these, those alkyl radicals are particularly preferred which are straight-chain. Those compounds in accordance with the formula I are particularly preferred in which the two R radicals are identical.

Examples of suitable groups X include: branched or straight-chain alkylene radicals containing 2 to 20 carbon atoms, in particular containing 4 to 15 carbon atoms, particularly preferably those straight-chain alkylene radicals containing terminal alkylene radicals,
branched or straight-chain polyols, in particular straight-chain polyols containing 1 to 12, preferably 1 to 6, repeating units of the formula —[OA]$_a$—, in which A is alkylene containing 2 to 4 carbon atoms,
cycloaliphatic alkylene containing preferably 6 to 12 carbon atoms, in particular 6 carbon atoms, i.e., cyclohexylidene, particularly preferably bonded in positions 1 and 4, or in particular containing 7 or 8 carbon atoms, position 1 and/or 4 on a cyclohexylidene radical additionally carrying a methylene group,
alkylene containing at leastone carbonyloxy group, in particular branched alkylene, the alkylene radicals which each flank a carbonyloxy group containing at least 3 carbon atoms, preferably at least 4 carbon atoms and at most 6 carbon atoms in each case,
preferably alkylene containing one carbonyloxy group.

The molecular weight (number average) of the compounds in accordance with the formula I is at most about 5,000, preferably at most about 3,000, and in particular at most about 1600. In special cases and depending on the other constituents of the radiation-sensitive mixture according to the invention, a molecular weight of at most about 1,000 may be advantageous. The compounds used according to the invention in accordance with formula I are also remarkable in that they contain a hydroxyl number of less than 1 mg of KOH/mg.

The ethylenically polyunsaturated compounds of formula I contain at least 2 and at most 6 carbon-carbon double bonds. The radiation-sensitive mixture according to the invention contains as polyunsaturated compound at least about 85% by weight, in particular at least about 90% by weight and preferably at least about 99% by weight of a compound of formula I. The balance to 100% by weight in each case is composed, inter alia, of polyunsaturated compounds in which a certain proportion of the R radical is replaced by X-OH. These compounds are therefore intermediates which have not been fully reacted to form compounds in accordance with formula I. Moreover, in addition to those in accordance with formula I, the mixture of the polyunsaturated compounds may also contain, in lesser amount, those in which n is greater than 5.

The ethylenically unsaturated compounds of formula I are oligomeric fumarates or maleates. They fulfill an important criterion which applies to photopolymeric layers: they have a high transparency for radiation in the visible and ultraviolet wavelength range. Troublesome cloudiness is produced, for example, by an incompatibility of the binder with the monomer. In particular, this effect can be observed in the case of oligomeric and polymeric fumarates or maleates which contain terminal carboxyl groups (R=H in formula I) or where n is excessively large (n>5). On the other hand, the ethylenically unsaturated compounds in accordance with formula I used according to the invention exhibit a very large application range. In particular, mixtures containing different binders are possible without reductions in transparency.

The synthesis method should therefore be so chosen or modified that it ensures reproducible products which satisfy the requirements of formula I. In particular, this is to be understood as referring to the low number average molecular weight required in accordance with formula I and a narrow molecular weight distribution.

In principle, the oligomeric esters of formula I can be prepared by known methods of organic preparative chemistry for synthesizing esters, for example:
by reacting carboxylic acid chlorides and/or carboxylic acid ester chlorides with the corresponding compounds containing alcohol groups (cf. A. Matsumoto et al., J. Polym. Sci. Polym. Chem. Ed. 21: 3191 (1983),
by direct esterification of compounds containing carboxyl groups, it also being possible to use monoesters of fumaric acid and bis(fumaric acid) monoesters such as are described, for example, in EP 069,226 as compounds containing carboxyl groups,
by transesterification, for example, of diesters of fumaric acid with diols in the presence of a catalyst.

A particularly advantageous transesterification method is one in which the dialkyl fumarate ROOC—CH=CH—COOR, in particular di-n-butyl fumarate, is used, together with a catalyst at high temperature. The dialkyl fumarate may be used in excess. A diol HO—X—OH is added more or less rapidly, possibly in portions. The alcohol ROH, for example, n-butanol, produced in accordance with the reaction equation

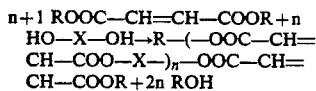

is removed from the reaction mixture by applying a vacuum. The transesterification catalysts used can be the compounds known from the literature (cf. Houben-Weyl, *Methoden der Organischen Chemie, (Methods of Organic Chemistry)*, vol. 8, page 702 et seq.).Dioctyltin oxide, which has already proved useful in similar reactions (DE 2,752,109), has proved advantageous; high conversions are achieved and the hydroxyl numbers of the products are less than 1 mg of KOH/g. Any excesses of diesters of fumaric acids used are subsequently separated off by vacuum distillation. Further working-up of the reaction product is, as a rule, unnecessary.

The usually liquid or waxy oligomeric fumarates produced are used in a proportion of about 1 to 40% by weight, preferably of about 2 to 20% by weight, in the radiation-sensitive mixture according to the invention.

The polymeric binders contained in the radiation-sensitive mixture according to the invention are thermoplastic elastomeric block copolymers of the formulae

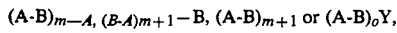

in which A is a thermoplastic, nonelastomeric polymer block having a glass transition temperature of about 25° C. or above and B is an elastomeric polymer block having a glass transition temperature of at most about 10° C., Y is Sn or Si, m is an integer from 1 to 10 and o is 2 if Y is Sn and o is 4 if Y is Si. The blocks A are preferably those which are prepared by polymerization of alkenylaromatic hydrocarbons, preferably vinyl substituted aromatic hydrocarbons, in particular monocyclic vinylaromatic hydrocarbons, while the blocks B are polymers of aliphatic conjugated diolefins. Particularly preferred as block A are polystyrene and poly($\alpha$-methylstyrene) and as block B polybutadiene and polyisoprene.

Specific examples of $(A\text{-}B)_m-A$ are polystyrene/polybutadiene/polystyrene, polystyrene/polyisoprene/polystyrene, poly($\alpha$-methylstyrene) /polybutadiene/poly($\alpha$-methylstyrene), polystyrene/polybutadiene/polystyrene/polybutadiene/polystyrene, polystyrene/butadiene/ polystyrene/butadiene /polystyrene/butadiene/polystyrene block polymers and their analogous block polymers in which the frequency m of the repeating unit (A-B) is up to 10.

Specific examples of $(B\text{-}A)_{m+1}-B$ are polybutadiene/polystyrene/polybutadiene/polystyrene/polybutadiene, polyisoprene/polystyrene/polyisoprene/polystyrene/polyisoprene block polymers and their analogous block polymers in which the frequency m of the repeating unit (B-A) is up to 10.

Specific examples of $(A-B)_{m+a}$ are polystyrene/polybutadiene/polystyrene/polybutadiene, polystyrene/polyisoprene/polystyrene/polyisoprene, poly($\alpha$-methylstyrene)/polybutadiene/poly($\alpha$-methylstyrene) /polybutadiene, polystyrene/polybutadiene /polystyrene/polybutadiene/polystyrene/polybutadiene block polymers and their analogous block polymers in which the frequency m of the repeating unit (A-B) is up to 10.

Specific examples of $(A\text{-}B)_oY$ are (polystyrene/polybutadiene)$_4$Si, (polystyrene/polyisoprene) $_4$Si and (polystyrene/polybutadiene)$_2$Sn.

Examples of thermoplastic, elastomeric block copolymers which can be used according to the invention are also the copolymers described in U.S. Pat. No. 3,265,765 and GB 1,366,769. These copolymers may be used individually or in combination.

Of these copolymers, those in which m is 1 are preferred because they exhibit a high rubber-like elasticity and are readily available. For example, polystyrene/polyisoprene/polystyrene, polystyrene/polybutadiene/polystyrene and polystyrene/polybutadiene/polystyrene/polybutadiene are preferred. For the same reasons, of the copolymers of the formula $(A\text{-}B)_oY$ (polystyrene/polybutadiene) $_4$Si is preferred.

The molecular weight (number average) of the thermoplastic, nonelastomeric polymer block is preferably about 2,000 to about 100,000, and the molecular weight (number average) of the elastomeric polymer block is about 25,000 to 1,000,000.

The proportion of the thermoplastic elastomeric block copolymer in the radiation sensitive mixture according to the invention is about 30 to 98% by weight, in particular about 50 to 96% by weight.

A multiplicity of substances can be used as photoinitiators in the mixture according to the invention. Examples are those which are derived from the parent substance of the benzophenones, acetophenones, benzoins, benzils, benzil monoketals, benzil diketals, fluorenone and thioxanthone, polynuclear quinones, acridines and quinoxalines; and also trichloromethyl-s-triazines, 2-halomethyl -5-vinyl-1,3,4-oxadiazole derivatives, halooxazoles substituted with trichloromethyl groups, carboxymethylene heterocycles in accordance with DE 3,333,450 containing trihalomethyl groups, acylphosphinoxy compounds such as are described, for example, in DE 3,133,419, and other phosphorus-containing photoinitiators, for example, the 6-acyl -(6H)-dibenz[c,e][1,2]-oxaphosphorine 6-oxides described in German P 38 27 735.2, in particular 6-(2,4,6-trimethylbenzoyl)-(6H)-dibenz[c,e][1,2]oxa-phosphorine 6-oxide. The photoinitiators can also be used in combination with one another or with coinitiators or activators, for example, with Michler's ketone and its derivatives or 2-alkyl anthraquinones.

The amount of photoinitiator is in general about 0.01 to 10% by weight, preferably about 0.5 to 5% by weight, of the radiation-sensitive mixture according to the invention.

It is often advantageous to add further auxiliaries and additives to the radiation-sensitive mixture, for example, thermal polymerization inhibitors such as hydroquinone and its derivatives, 2,6-di-tert-butyl-p-cresol, nitrophenols, nitrosamines such as N-nitrosodiphenylamine or salts of N-nitrosocyclohexylhydroxylamine, for example, its alkali-metal or aluminum salts. Further standard additives include dyes, pigments, processing aids and plasticizers.

For producing relief and flexographic printing plates, the mixture according to the invention can be formed into layers having a thickness of about 0.02 to 10, preferably of about 0.2 to 7.0 mm, by pouring from solution or extruding and calendering. The layer can be laminated onto the surface of a suitable base, for example, by calendering, or the solution of the mixture according to the invention can be deposited on a layer base. Suitable bases are, for example, polyester sheets, steel or aluminum sheets, foam material layers or rubbery bases. A precoating of the layer base may be advantageous. The additional layer produced between the base and the radiation sensitive layer by the precoating may be effective, for example, as an antihalation layer or as an adhesive layer. It may be advantageous to deposit a thin top layer, for example, a polyamide layer and/or a peelable protective sheet, for example, of polyethylene glycol terephthalate, on the radiation sensitive recording layer. This can also be done by calendering.

In particular, the production of relief and flexographic printing plates is achieved by a combined extrusion and calendering method in which the melt is fed into the calender nip of a two-roll calender from an extruder, in particular a twin-screw extruder, via a slot die. The desired thickness is formed in the nip. Both the base sheet and the top layer can additionally be concomitantly introduced via the two rolls so that the final multilayer element is obtained after leaving the calender. An appropriate method is described in EP 080,665.

The multilayer element then undergoes preferably a full-surface rear-side exposure so that a stable printing plate base forms. The photosensitive exposure to an image then takes place. For this purpose, the recording material according to the invention is exposed imagewise with actinic light from light sources such as mercury vapor lamps or fluorescent tubes, the emitted wavelength preferably being between 300 and 420 nm. The unexposed and uncrosslinked layer portions can be removed by spraying, washing or brushing with a suitable solvent, for example 1,1,1-trichloroethane, tetrachloroethane, toluene or mixtures of one of these solvents with at most about 50% by weight of an alcohol, for example n-butanol. Expediently, the developed relief plates are dried at temperatures up to 120° C. and are optionally post-exposed simultaneously or thereafter with actinic light.

The recording material according to the invention is suitable, in particular, for producing printing plates, especially letterpress or relief printing plates, which are particularly suitable for flexographic printing. Surprisingly, the radiation-sensitive mixtures according to the invention which contain the compounds of formula I as polyunsaturated compounds are remarkable for a higher photosensitivity than comparable mono- or diesters of the corresponding fumaric or maleic acid. They also exhibit a higher storage and thermal stability than the customary acrylic acid or methacrylic acid derivatives and are less volatile and irritating than the latter. The present radiation-sensitive mixture according to the invention exhibits, therefore, only the advantages of all the monomers known hitherto, without exhibiting their disadvantages. Added to this is the fact that the mixtures according to the invention make possible the production of relief printing plates which have a Shore A hardness higher than 34 (DIN 53 505).

The invention is explained by the following illustrative examples.

PREPARATION EXAMPLE 1

182.6 parts by weight of di-n-butyl fumarate,
57.4 parts by weight of a branched alkanediol containing primary hydroxyl groups and 15 carbon atoms (®Diol 100 supplied by Sartomer Co., OH number 380 mg of KOH/g),
1.0 part by weight of 2,6-di-tert-butyl-p-cresol, and
0.4 part by weight of di-n-octyltin oxide are heated in a glass flask to 110° C. in an oil bath with stirring. The n-butanol produced is distilled off at a vacuum of 25 torr in the course of 3 hours. Then the excess di-n-butyl fumarate is distilled off at a vacuum of 0.01 mbar and an oil bath temperature of 150° C. An oily product (108.2 g) with a hydroxyl number of less than 1 mg of KOH/g is obtained as residue.

PREPARATION EXAMPLES 2 to 9

One part by weight of 2,6-di-tert-butyl-p-cresol, 0.4 part by weight of di-n-octyltin oxide and the amounts of di-n-butyl fumarate and alkanediol shown in Table I are reacted analogously to Preparation Example 1 and then worked up. The hydroxyl numbers of the products are less than 1 mg of KOH/g. The results are summarized in Table I.

TABLE I

| Preparation Example | Di-n-butyl fumarate (pts. by wt.) | Alkanediol (pts. by wt.) | |
|---|---|---|---|
| 2 | 182.6 | 20.8 | 2,2-Dimethyl-1,1-propanediol |
| 3 | 137.0 | 23.6 | 1,6-Hexanediol |
| 4 | 182.6 | 23.6 | 1,6-Hexanediol |
| 5 | 200.6 | 31.7 | 1,4-Bis(hydroxymethyl)cyclohexane |
| 6 | 200.6 | 31.7 | 1,4-Bis(hydroxymethyl)cyclohexane* |
| 7 | 182.6 | 130.0 | Polytetramethylene ether hexane* |
| 7 | 182.6 | 130.0 | Polytetramethylene ether glycol** |
| 8 | 137.0 | 40.9 | Neopentyl glycol 1-hydroxypivalate |
| 9 | 182.6 | 32.0 | 2-Ethyl-2-butyl-1,3-propanediol |

*Continuous addition of the diol at 110° C. oil bath temperature in the course of 3 hours
**Polytetrahydrofuran 650 supplied by BASF AG, OH number 166 mg of KOH/g.

APPLICATION EXAMPLE 1

94 parts by weight of a styrene/isoprene/styrene three-block copolymer with a styrene content of 15% (®Europrene SOL T 190 supplied by Enichem),
4 parts by weight of the oligomeric fumarate described in Preparation Example 1,
0.3 part by weight of 2,6-di-tert-butyl-p-cresol, and
2 parts by weight of benzil dimethyl ketal are dissolved in
100 parts by weight of toluene and poured onto a 0.125 mm thick polyethylene glycol terephthalate sheet to form a 6.0 mm thick layer. After evaporation of the toluene, the polyethylene glycol terephthalate sheet is peeled off and the remaining 3.0 mm thick photopolymeric layer is pressed between two precoated polyethylene glycol terephthalate sheets in a plate press at 120° C. for minutes. The polyester sheets are precoated such that, in the multilayer element produced, a 0.005 mm thick copolyamide layer (®Makromelt 6900 supplied by Henkel) is formed as a top layer between the photopolymeric layer and a polyester sheet which acts as protective sheet. A 0.0005 mm thick adhesive layer such as is described in DE 3,740,432 is also produced between the photopolymeric layer and the second polyester sheet which serves as base sheet. After hot pressing, the thickness of the photopolymeric layer is 2.53 mm. The photopolymeric layer is now exposed from the back without a master using a UVA flat-bed exposure apparatus having an emission wavelength range of 320 to 400 nm and an intensity of 10.7 mW/cm$^2$. It is then exposed imagewise from the opposite side after peeling off the polyester protective sheet and placing a negative of the image on the copolyamide top layer.

To determine the minimum exposure time, i.e., the time necessary to image the 0.055 mm line grid present on a standard negative precisely on the printing plate to be produced, exposure is carried out in steps through a standard negative. After washing out the unexposed image area with tetrachloroethene/n-butanol 4:1, post-exposure is carried out for 10 minutes.

To produce a flexographic printing plate having a total thickness of 2.66 mm, a relief depth of 1.1 mm and a perfect relief formation of the 0.055 mm line grid, a rear-side preexposure of 148 seconds and a minimum image exposure time of 13 minutes are necessary. The Shore A hardness of the radiation-crosslinked photopolymeric layer is 46.

APPLICATION EXAMPLES 2 to 9

94 parts by weight of the three-block copolymer described in Application Example 1, 4 parts by weight of one of the oligomeric fumarate described in Preparation Examples 2 to 9.

0.3 part by weight of 2,6-di-tert-butyl -p-cresol, and 2 parts by weight of benzil dimethyl ketal are produced as described in Application Example 1 to produce a flexographic printing plate having a total thickness of 2.66 mm. The rear-side preexposure times necessary in each case to build up a 1.56 mm thick foundation and the Shore A hardness of the respective radiation-crosslinked photopolymeric layers are shown in Table II.

TABLE II

| Application Example | Monomer according to Prep. Example | Rear-side preexposure time for 1.56 mm foundation height | Shore A hardness |
|---|---|---|---|
| 2 | 2 | 80 | 43 |
| 3 | 3 | 55 | 44 |
| 4 | 4 | 104 | 45 |
| 5 | 5 | 135 | 43 |
| 6 | 6 | 115 | 50 |
| 7 | 7 | 125 | 39 |
| 8 | 8 | 85 | 42 |
| 9 | 9 | 34 | 34 |

COMPARATIVE EXAMPLE 1

94 parts by weight of the three-block copolymer described in Application Example 1, 4 parts by weight of bis(2-ethylhexyl) fumarate, 0.3 part by weight of 2,6-di-tert-butyl-p -cresol, and 2 parts by weight of benzil dimethyl ketal are processed analogously to Application Example 1 to produce a flexographic printing plate.

To produce a flexographic printing plate having a total thickness of 2.66 mm, a relief depth of 1.1 mm and a perfect relief formation of the 0.055 mm line grid, a rear-side preexposure time of 294 seconds and a minimum image exposure time of 40 min are necessary. The Shore A hardness of the radiation-crosslinked photopolymeric layer is only 33.

What is claimed is:

1. A radiation-sensitive mixture, comprising, in admixture:

a) at least one thermoplastic, elastomeric block copolymer of the formulae

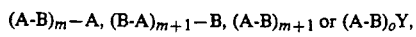

in which

A is a thermoplastic, nonelastomeric polymer block having a glass transition temperature of 25° C. or above, and B is an elastomeric polymer block having a glass transition temperature of 10° C. or below, Y is Sn or Si, m is an integer from 1 to 10, and o is 2 if y is Sn, or 4 if y is Si, b) at least one ethylenically polyunsaturated compound, and c) a photopolymerization initiator, wherein at least one of the ethylenically polyunsaturated compounds corresponds to the formula I

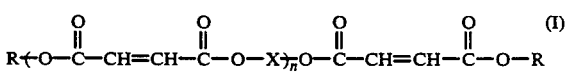

where

R is a straight-chain or branched alkyl radical;

X is a straight-chain alkylene or cycloalkylene, in which individual methylene groups may be substituted by —O—, —S—, carbonyl or carbonyloxy groups, and n is 1 to 5.

2. A radiation-sensitive mixture as claimed in claim 1, wherein R is an alkyl radical containing 1 to 8 carbon atoms.

3. A radiation-sensitive mixture as claimed in claim 1, wherein R is an alkyl radical containing 1 to 4 carbon atoms.

4. A radiation-sensitive mixture as claimed in claim 1, wherein R is a straight-chain alkyl radical.

5. A radiation-sensitive mixture as claimed in claim 1, wherein X is an alkylene containing 2 to 20 carbon atoms.

6. A radiation-sensitive mixture as claimed in claim 1, wherein X is an alkylene containing 4 to 15 carbon atoms.

7. A radiation-sensitive mixture as claimed in claim 6, wherein X is straight-chain alkylene and carries terminal alkylene radicals.

8. A radiation-sensitive mixture as claimed in claim 1, wherein X is a straight-chain polyol containing 1 to 6 repeating units of the formula —[OA]$_a$—, in which A is alkylene containing 2 to 4 carbon atoms.

9. A radiation-sensitive mixture as claimed in claim 1, wherein X is a cycloalxylene containing 6 to 12 carbon atoms.

10. A radiation-sensitive mixture as claimed in claim 9, wherein the cycloalkylene is cyclohexylidene bonded in the 1- and 4-positions.

11. A radiation-sensitive mixture as claimed in claim 9, wherein a methylene group is present in at least one of positions 1 and 4.

12. A radiation-sensitive, mixture as claimed in claim 1, wherein the cycloalxylene is cyclohexylidene bonded in the 1- and 4-positions.

13. A radiation-sensitive mixture as claimed in claim 12, wherein a methylene group is present in at least one of positions 1 and 4.

14. A radiation-sensitive mixture as claimed in claim 1, wherein a methylene group is present in at least one of positions 1 and 4.

15. A radiation-sensitive mixture as claimed in claim 1, wherein X is alkylene containing —O— or carbonyloxy as a substituent.

16. A radiation-sensitive mixture as claimed in claim 15, wherein X is alkylene containing at least one carbonyloxy group and is branched.

17. A radiation-sensitive mixture as claimed in claim 1, wherein X is alkylene containing at least one carbonyloxy group and is branched.

18. A radiation-sensitive mixture as claimed in claim 16, wherein the alkyl radicals flanking a carbonyloxy group contain at least 3 carbon atoms and at most 6 carbon atoms.

19. A radiation-sensitive mixture as claimed in claim 1, wherein the ethylenically polyunsaturated compound contains at least 2 and at most 6 carbon-carbon double bonds.

20. A radiation-sensitive mixture as claimed in claim 1, wherein the ethylenically polyunsaturated compound has a number average molecular weight of at most about 5,000.

21. A radiation-sensitive mixture as claimed in claim 1, wherein the ethylenically polyunsaturated compound has a number average molecular weight of at most about 3,000.

22. A radiation-sensitive mixture as claimed in claim 1, wherein the ethylenically polyunsaturated compound contains at least 85% by weight of a compound in accordance with formula I.

23. A radiation-sensitive mixture as claimed in claim 1, wherein the hydroxyl number of the compound in accordance with formula I is less than 1 mg of KOH/g.

24. A radiation-sensitive mixture as claimed in claim 1, comprising about 1 to 40% by weight of an ethylenically polyunsaturated compound.

25. A radiation-sensitive mixture as claimed in claim 1, comprising about 2 to 20% by weight of an ethylenically polyunsaturated compound.

26. A radiation-sensitive mixture as claimed in claim 1, wherein the thermoplastic, nonelastomeric polymer block has a molecular weight of about 2,000 to 100,000.

27. A radiation-sensitive mixture as claimed in claim 1, comprising about 0.01 to 10% by weight of a photoinitiator.

28. A radiation-sensitive mixture as claimed in claim 1, comprising about 0.5 to 5% by weight of a photoinitiator.

29. A recording material for producing relief and letterpress printing plates, comprising:
a layer base; and
a radiation-sensitive mixture as claimed in claim 1 deposited on said layer base.

30. A recording material as claimed in claim 29, additionally comprising a coating of a thin, optionally peelable top layer.

31. A process for producing a recording material, comprising the steps of:
depositing a radiation-sensitive mixture as claimed in claim 1 on a layer base;
exposing the front side imagewise; and
removing the unexposed parts of the layer with a developer.

32. A process as claimed in claim 31, additionally comprising the step of conveying the radiation-sensitive layer with a thin, optionally peelable top layer.

33. A process as claimed in claim 31, additionally comprising the step of a full-surface rear-side exposure prior to said imagewise exposure.

34. A process as claimed in claim 31, additionally comprising a step of an exposure with actinic light after a step of removing portions that are unexposed during said imagewise exposure.

35. A radiation sensitive mixture as claimed in claim 1, consisting essentially of the thermoplastic, elastomeric block copolymer, the ethylenically polyunsaturated compound according to formula I and a photopolymerization initiator.

36. A process as claimed in claim 1, wherein the ehtylenically polyunsaturated compound contains at least about 90% by weight of a compound in accordance with formula I.

37. A process as claimed in claim 1, wherein the ethylenically polyunsaturated compound contains at least about 99% by weight of a compound in accordance with formula I.

* * * * *